United States Patent [19]

Iverson et al.

[11] Patent Number: 5,539,251

[45] Date of Patent: Jul. 23, 1996

[54] TIE BAR OVER CHIP LEAD FRAME DESIGN

[75] Inventors: Robert E. Iverson; Walter L. Moden, both of Boise, Id.

[73] Assignee: Micron Technology, Inc., Boise, Id.

[21] Appl. No.: 390,606

[22] Filed: Feb. 17, 1995

Related U.S. Application Data

[63] Continuation of Ser. No. 180,186, Jan. 11, 1994, abandoned, which is a continuation of Ser. No. 880,935, May 11, 1992, abandoned.

[51] Int. Cl.$^6$ .................................................. H01L 23/495
[52] U.S. Cl. .......................... 257/670; 257/666; 257/667; 257/668; 257/669; 257/676
[58] Field of Search ...................................... 257/666, 667, 257/668, 670, 676, 669

[56] References Cited

U.S. PATENT DOCUMENTS 5,294,827  3/1994  McShane ................................ 257/666

Primary Examiner—Sara W. Crane
Assistant Examiner—Valencia Martin Wallace
Attorney, Agent, or Firm—Kevin D. Martin

[57] ABSTRACT

A "leads over chip" lead frame design is disclosed which can be used with a conventional die having leads located at the periphery. The inventive design uses an elongated tie bar which extends from one side of the lead frame to the other, across the die. The die is attached to the bottom of the tie bar, then the bond pads are wire bonded to the lead fingers. The lead fingers of the inventive lead frame do not extend over the top of the die, but are positioned in close proximity to allow for short bond wires. The die and a portion of the lead fingers are encapsulated, and the tie bars are severed to separate them from the lead frame. The invention allows the advantages of a leads over die configuration with a conventional die having bond pads located at the periphery. Therefore, a single die can be manufactured which can be used either with the inventive lead frame for a plastic package, or with a ceramic package.

22 Claims, 5 Drawing Sheets

TIE BAR OVER CHIP LEAD FRAME DESIGN

This is a continuation of application Ser. No. 08/180,186 filed Jan. 11, 1994, abandoned, which was a continuation of application Ser. No. 07/880,935 filed on May 11, 1992, abandoned.

FIELD OF THE INVENTION

This invention relates to the field of semiconductor manufacture. More specifically, a leads over die lead frame design is described which allows for a smaller package, alleviates problems associated with the die paddle, and allows a single die design to be used in either a plastic or ceramic package.

BACKGROUND OF THE INVENTION

Various types of semiconductor devices are manufactured in much the same way. A starting substrate, usually a thin wafer of silicon or gallium arsenide, is masked, etched, and doped through several process steps, the steps depending on the type of devices being manufactured. This process yields a number of die on each wafer produced. The die are separated with a die saw, and then packaged into individual components.

During the plastic packaging process, several semiconductor die are attached to a lead frame, often with a material such as metal, or an epoxy or other viscous adhesives. Bond wires couple each of several terminals (bond pads) on each die to conductive leads on the lead frame. The die, the wires, and a portion of the leads are encapsulated in plastic. These leads couple the die with the device into which the component is installed, thereby forming a means of input/output (I/O) between the die and the device. A die is encased in ceramic by attaching the die to a shelf in the preformed package, then bond wires couple bond pads on the die with attachment points on a second shelf of the ceramic package. Traces couple these points on the second shelf to the exterior of the package. Leads can be coupled thereto to allow for I/O between the die and the device into which the package is installed.

One step of semiconductor manufacture that is not without problems is the die-lead frame attachment. During the manufacturing process, several die are attached to a length of lead frame at separate locations along the lead frame. Bond wires are then connected from the bond pads on each of the die to the "fingers" on the lead frame, after which each die is encapsulated in a protective plastic casing. The plastic packages are separated, and the leads are formed into a desired shape.

The lead frame, part of which will eventually form the conductive leads of the components, contains a major surface to which the die is attached, called the "paddle." The die is normally bonded to the paddle with epoxy or metal, although thermoplastic, tape, or another materials are also used. The paddle, which covers the entire bottom surface of the die, is connected to the lead frame with a tie bar. The tie bar, which is connected at either end to one rail of the lead frame, is typically severed after encapsulation of the die to separate the paddle from the lead frame, the tie bar serving to support the paddle and the die attached to the paddle before encapsulation.

FIG. 1A is a top view, and FIG. 1B is a cross section, showing a conventional lead frame 10 having die paddles 12 with die 14 attached. The frame 10 comprises dam bars 16 which restrict the flow of encapsulating material during encapsulation, exterior leads 18 which are unencapsulated, and lead fingers 20 which will be encapsulated. Bond wires 22 electrically couple bond pads 24 on the die 14 with the lead fingers 20. The adhesive 26 used to attach the die 14 to the lead frame 10 is dispensed on the die paddle area 12 of the lead frame 10. The die 14 is placed on the uncured epoxy (for example) and held at a specific pressure by die attachment equipment having a surface contact tool or an edge contact only tool (collet). The die is pressed down into the adhesive at a specific pressure, and often at a controlled temperature, by the tool and held in place long enough to ensure adhesion. X-Y movement (scrub) is sometimes used to increase adhesion and to speed the process. The attach process often requires a follow-on cure in a separate cure oven. After the attach process, the assembly within the dam bars 16 is encapsulated. The paddle 12 of the lead frame 10 is usually at a lower plane 28, which allows better control of the plastic encapsulation material as it is being injected into the mold. This lessens the chance, for example, of the bond wires 22 detaching from the lead fingers or bond pads. The paddle 12 is connected at either end to the rails 30 of the lead frame 10 by a pair of tie bars 32.

Various problems are associated with the connection of the die to the die paddle. Occasionally a corner of the die will crack, thereby making the semiconductor inoperable. This can result from stress placed upon the die by the adhesive due to an uneven thermal coefficient of expansion between the die and the adhesive. After the die is attached to the lead frame and oven cured, the assembly is heated at the wire bond step to attach the wire to the die pad. If the die and the adhesive expand at different rates, undue stresses can be inflicted on the die. Cracks can also occur from stress on the die due to shrinkage of the adhesive as it cures, although in recent years chemical improvements in adhesive has reduced this cause of cracking.

The paddle itself also creates extra expense. The package leads are typically gold or silver plated, and the die paddle is also plated along with the conductive leads, in part because the paddle cannot economically be masked during plating of the conductive leads. The leads are plated to provide the proper metallic surface to which to wire bond since the bond wire will not stick directly to the material usually used for the lead frame, such as copper or alloys. The plating of the paddle, however, serves no functional purpose. This unnecessary gold or silver plating of the paddle, which is a relatively large surface, adds unnecessary cost to the product.

Occasionally the die and epoxy may come loose from the lead frame, a problem referred to as "popping die." Popping die can result from too little adhesive under the die, a poor bond between the adhesive and the paddle, or from bowing of the die paddle from heat or pressure. This can be a serious problem, not only because it results in scrapping the die but also because the loose die can damage the molds which are used to encapsulate the package.

One way to solve the problems associated with the lead frame paddle is described in U.S. Pat. No. 4,862,245 by Pashby, et al. which is incorporated herein by reference. Pashby, et al. describe a die which allows for a "leads over die" configuration, in which the leads are attached to the top of the die, then the bond pads are coupled with the lead fingers by bond wires. A leads over die configuration has the advantage of not requiring a die paddle. It also allows for a smaller package, as well as other advantages described therein.

One disadvantage of the die described in Pashby, et al. is that it is difficult to incorporate into a conventional ceramic package. FIG. 2 shows a conventional die 14 in a ceramic package 40 having a desirable length of bond wires 22, and FIG. 3 shows a die 50 of Pashby, et al. in a similar package 40, which requires excessively long bond wires 52 to couple bond pads 24 in the center of the die 50 to the attachment points 54 on the second shelf. Long bond wires are known to have reliability problems, for instance under high gravitational forces. A manufacturer would need a pair of die designs, one for a plastic "leads over die" configuration, and one for a ceramic package.

Additional die designs are typically avoided by a semiconductor manufacturer wherever possible. A lead frame design which does not require a die paddle and which allows the advantages of a leads over die configuration using a conventional die design would be desirable.

SUMMARY OF THE INVENTION

An object of the invention is to provide a lead frame design which allows for a leads over die configuration using a conventional die having bond pads located along its edges. Another object of the invention is to provide a lead frame design which allows for a smaller package due to its leads over die configuration. Another object of the invention is to provide a leads over die lead frame configuration which uses a conventional die having bond pads located at its periphery. Yet another object of the invention is to provide a lead frame design which does not have a die paddle, and therefore imparts less stress on the die. Still another object of the invention is to provide a lead frame which in one embodiment allows a means for busing a signal such as power or ground to a number of different bond pads on the die as desired.

These objects of the invention are realized by providing a lead frame having a type of tie bar which extends across the die, from one rail of the lead frame to the other. The top side of the die can be attached to the underside of the tie bar by adhesive means such as double-sided tape, epoxy, or other workable means. Double-sided tape material, usually a layer of polyimide or plastic coated with a heat cured thermoset, is well known in the art. A passivating layer over the die circuitry may be required. After the die is attached to the tie bar, the bond pads are coupled with the lead fingers by wire bonding. A bond pad may also be attached to the bus bar, most commonly to receive power or ground. The bus bar is then routed to an I/O lead to couple with power or ground.

It should be noted that the tie bar of the invention does not support the paddle of the lead frame as does a conventional tie bar, as there is no paddle, but is a tie bar insofar as it is connected at either end to one of the lead frame rails. The tie bars of the invention serve to "tie" the die to the lead frame rails and to support the die before encapsulation.

It should be emphasized that the drawings of the instant application are not to scale but are merely schematic representations and are not intended to portray the specific parameters or the structural details of the invention, which can be determined by one of skill in the art by examination of the information herein.

DETAILED DESCRIPTION OF THE INVENTION

Figure 1A:
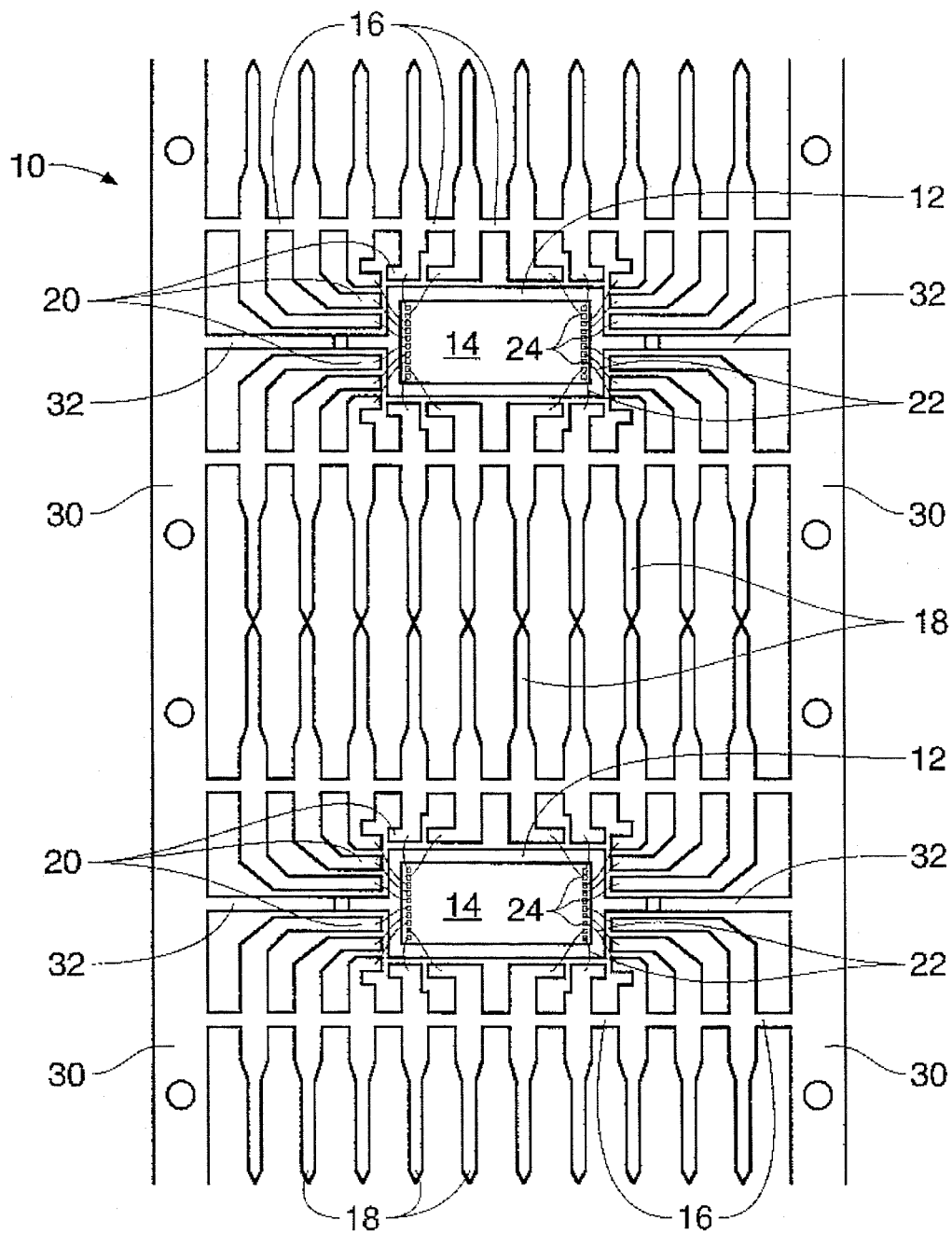
FIG. 1A is a top view.
Figure 1B:
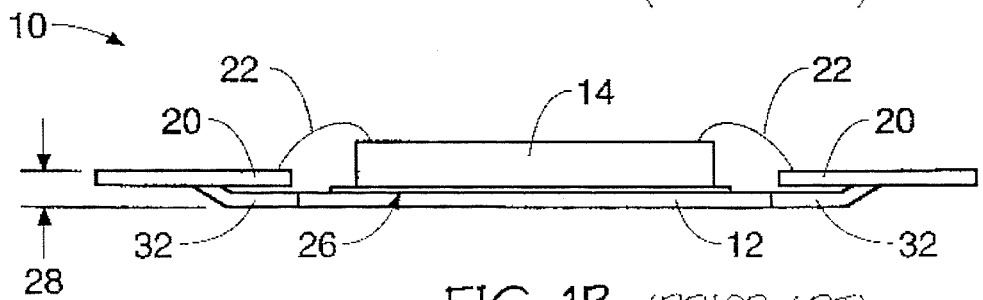
FIG. 1B is a cross section, of a conventional lead frame design comprising a die paddle.
Figure 2:
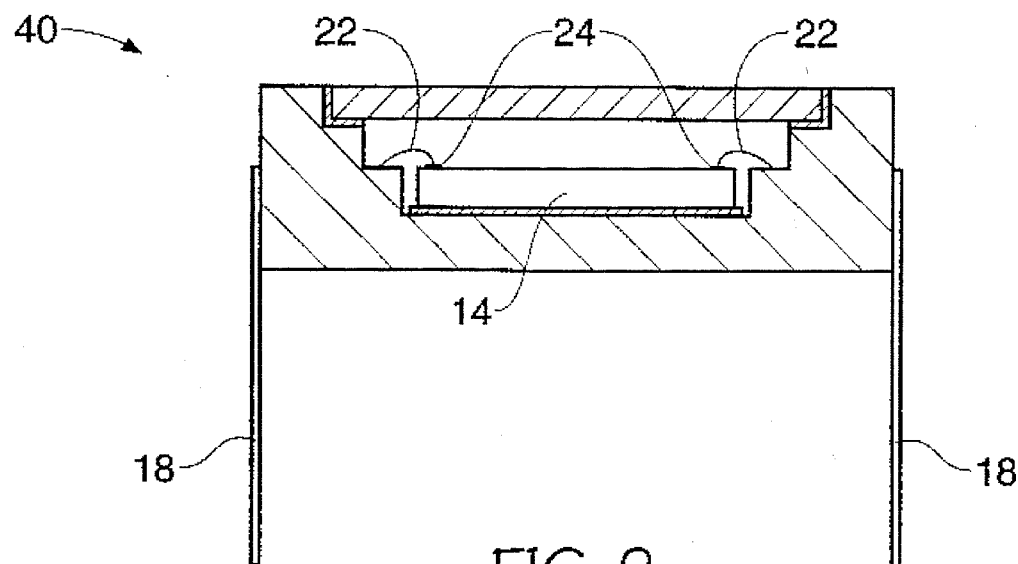
FIG. 2 is a cross section of a conventional die in a ceramic package.
Figure 3:
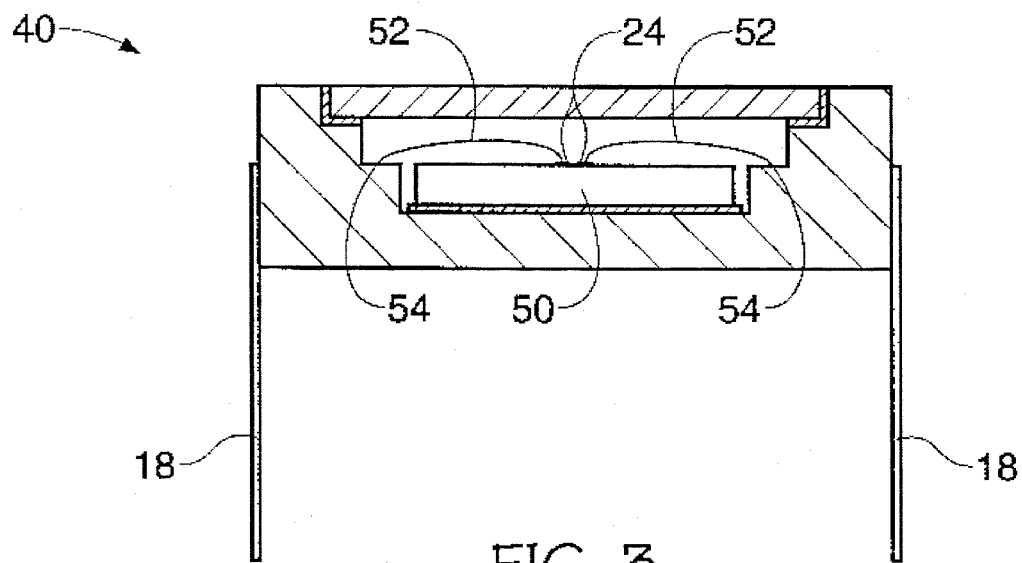
FIG. 3 is a cross section of a die having centrally located bond pads in a conventional ceramic package.
Figure 4:
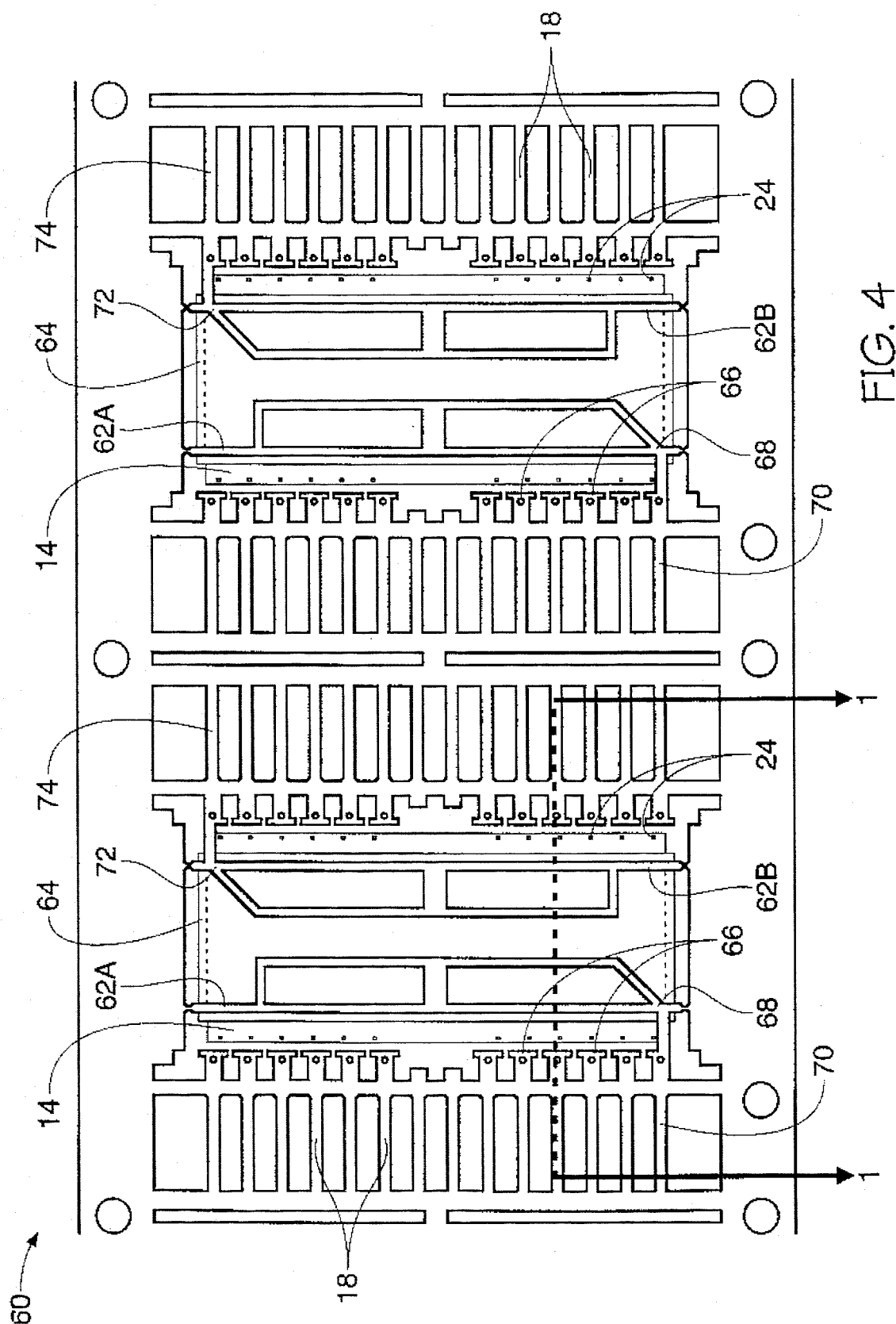
FIG. 4 is a top view of an embodiment of the inventive lead frame comprising a pair of tie bars extending across the die.
Figure 5:
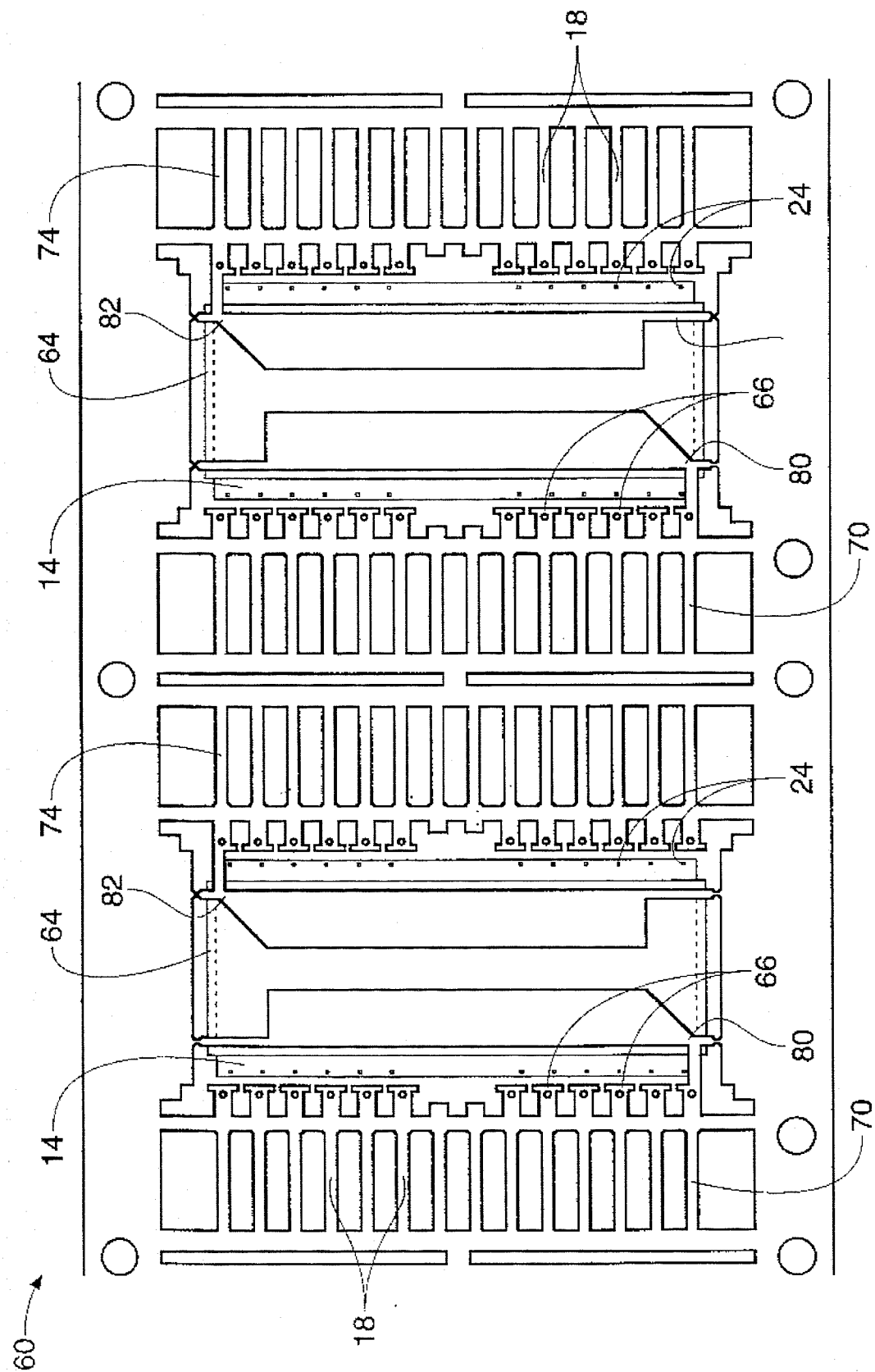
FIG. 5 is a top view of another embodiment of the invention having solid tie bars 80, 82.
Figure 6:
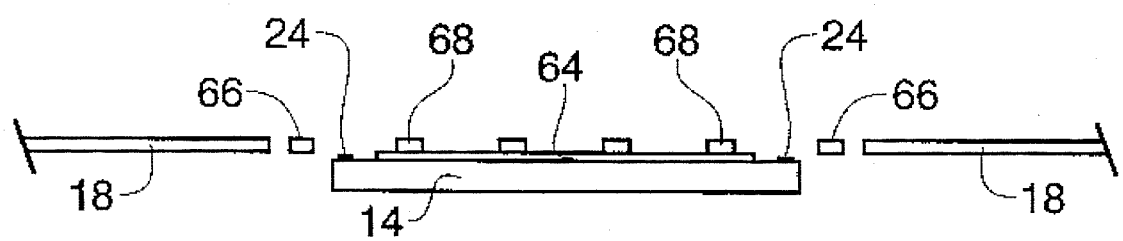
FIG. 6 is a cross section along "AA" of FIG. 4.

FIG. 4 shows a lead frame 60 comprising the invention. In this embodiment, the die paddle of the conventional lead frame of FIG. 1 was replaced with a pair of elongated "tie bars" 62A, 62B, which extend from one side of the lead frame to the other. The tie bars 62 received the die 14, which was attached thereto. The tie bars 62A, 62B were formed as shown, and also in another embodiment as a pair of solid structures, and either embodiment proved sufficient. The solid tie bars are shown in FIG. 5 as elements 80 and 82. After the die 14 was mounted to the tie bars 62 with double-sided tape 64 (epoxy resin glue or other means may also be sufficient), bond pads 24 peripherally located on the die 14 were coupled with the lead fingers 66 by bond wires 22. Note that the lead fingers 66 were not in contact with the die 14 itself, and do not cross over the die 14 as is the case with the "leads over die" configuration of Pashby '245. As can be seen from FIG. 4 the lead fingers 66 instead at a perimeter of the die 14. As shown in FIG. 4, one tie bar 62A was coupled at one point 68 with the lead finger of an I/O lead 70 to supply power, while the second tie bar 62B was coupled at a point 72 with the lead finger of an I/O lead 74 to supply ground. It can be seen from FIG. 4 that after encapsulation each support structure 62A, 62B is connected to the lead frame at only a single location 68, 72. In other embodiments it may also be desirable to couple the tie bar to a data signal. Coupling the tie bar with an I/O lead is not, however, a requirement of the invention, as the tie bars can serve simply to support the die and attach it to the lead frame rails before encapsulation. If the bars are coupled with power or ground, they provide a large bus to which numerous bond pads can be coupled.

Depending on the means for attaching the die to the tie bars, the circuitry on the die may require protection. A passivating layer of polymeric film served this purpose, and other means may be sufficient. Desirable thicknesses and application techniques for the passivating layer are well known in the art of semiconductor manufacture as the layer is often used as an alpha barrier.

The inventive lead frame has advantages over a conventional lead frame having a die paddle. With the inventive lead frame, a smaller area is attached to the die as compared with the die paddle. The difference in thermal expansion, therefore, is not as critical as when a large die paddle is connected with the die, and there is less chance of cracking the die. It was also determined during environmental testing that the plastic package had more resistance to the encroachment of moisture than a package using a conventional lead frame with a large die paddle.

The inventive lead frame also has advantages when compared with other "leads over die" lead frames. A single die having bond pads located along the periphery can be manufactured and used in either a plastic package in a leads over die configuration, or in a ceramic package. Typical leads over die configurations require a die having centrally located bond pads, which cannot be incorporated into a conventional ceramic package. To produce both plastic and ceramic packages, a manufacturer would need to produce and/or stock at least two die configurations, which can be expensive and a logistical encumbrance as compared with producing and/or stocking a single die style.

While this invention has been described with reference to illustrative embodiments, this description is not meant to be construed in a limiting sense. Various inventive embodiments will be apparent to persons skilled in the art upon reference to this description, and the appended claims will cover any such embodiments as fall within their scope. For example, even though the embodiment of FIG. 4 shows a pair of tie bars, it may be possible to adequately support the die with a single tie bar, depending on the width of the bar.

We claim:

1. A semiconductor device comprising a lead frame and further comprising:
   a) a die having a length, a major surface, and a plurality of terminals peripherally located on said major surface;
   b) a plurality of lead fingers terminating at a perimeter of said die, said die inwardly set from said lead fingers;
   c) at least first and second tie bars supportively connected to said major surface of said die and extending more than half said length of said die, said tie bars being electrically isolated from each other, each of said tie bars connected to said lead frame at only a single location; and
   d) encapsulation material surrounding said die.

2. The semiconductor device of claim 1 further comprising:
   a) a plurality of conductive input/output leads; and
   b) bond wires electrically coupling said lead fingers to said terminals.

3. The semiconductor device of claim 1 further comprising said first tie bar electrically coupled with a first lead finger and said second tie bar electrically coupled with a second lead finger.

4. The semiconductor device of claim 3 further comprising at least one of said terminals electrically coupled with one of said lead fingers through one of said tie bars.

5. The semiconductor device of claim 1 comprising at least one of said terminals electrically coupled with one of said tie bars.

6. A semiconductor device comprising:
   a) a die having a length and having terminals on a major surface;
   b) encapsulation material surrounding said die;
   c) a lead frame comprising:
      i) at least first and second die support structures supportively connected to said major surface of said die, said support structures extending more than half said length of said die, said support structures electrically isolated from each other, each of said support structures connected to said lead frame at only a single location, said die inwardly set from said lead fingers;
      ii) a plurality of lead fingers terminating at a perimeter of said die;
   said terminals interposed between said support structure and said lead fingers.

7. The semiconductor device of claim 6 further comprising:
   a) a plurality of conductive input/output leads; and
   b) bond wires electrically coupling said lead fingers to said terminals.

8. The semiconductor device of claim 6 further comprising said first support structure connected to a first lead finger and said second support structure connected to a second lead finger.

9. The semiconductor device of claim 6 further comprising at least one of said terminals electrically coupled with one of said lead fingers through one of said support structures.

10. The semiconductor device of claim 6 comprising at least one of said terminals electrically coupled with one of said support structures.

11. The semiconductor device of claim 6 further comprising:
   a) a first set of terminals along a first side of said die and a second set of terminals along a second side of said die opposite said first side;
   b) a first set of lead fingers terminating at said first side of said die and a second set of lead fingers terminating at said second side of said die;
   said first and second support structures interposed between said first and second sets of terminals.

12. The semiconductor device of claim 11 further comprising:
   a) said first set of terminals interposed between said first support structure and said first set of lead fingers; and
   b) said second set of terminals interposed between said second support structure and said second set of lead fingers.

13. A semiconductor device comprising a lead frame and further comprising:
   a) a die having a length, a major surface, and a plurality of terminals peripherally located on said major surface;
   b) encapsulation material surrounding said die;
   c) plurality of leads terminating at a perimeter of said die, said die inwardly set from said leads;
   c) at least first and second support structures supportively connected to said major surface of said die and extending more than half said length of said die, said support structures being electrically isolated from each other, each of said support structures connected to said lead frame at only a single location,
   said terminals interposed between said support structure and said leads.

14. The semiconductor device of claim 13 further comprising said first support structure electrically coupled with a first lead and said second support structure electrically coupled with a second lead.

15. The semiconductor device of claim 14 further comprising at least one of said terminals electrically coupled with one of said leads through through one of said support structures.

16. The semiconductor device of claim 1 wherein each of said tie bars is connected to said lead frame at one of said lead fingers.

17. The semiconductor device of claim 1 wherein said first tie bar has a first potential attached thereto and said second tie bar has a second potential attached thereto.

18. A semiconductor device, comprising:
   a semiconductor die;
   a lead frame assembly coupled to said die, said lead frame assembly comprising a plurality of lead contact points, said lead frame assembly further comprising at least two tie bars configured for attachment to said die, said tie bar coupled to the remainder of said frame at only a single location, said at least two tie bars in generally opposed relation to one another relative to the location of attachment to said die, with said at least two tie bars each extending the majority of the length of said die.

19. The device of claim 18, wherein at least one of said leads is coupled to a reference potential.

20. A semiconductor device, comprising:

a semiconductor die; and a lead frame assembly coupled to said die, said lead frame assembly comprising a plurality of lead fingers, said lead frame assembly defining a generally rectangular die mounting location inwardly offset from said lead fingers, said lead frame assembly further comprising a plurality of tie bars extending into said die mounting location, said tie bars configured to be coupled to said die, at least two of said tie bars in generally opposed relation to one another, and said tie bars physically independent of one another within the perimeter of said die, each said tie bar extending the majority of the length of said die, and each said tie bar coupled to the remainder of said lead frame assembly at only a single location.

21. The semiconductor device of claim 20, further comprising an encapsulating material encapsulating said die and a portion of said lead frame assembly.

22. The semiconductor device of claim 20 wherein at least one of said tie bars defines a perimeter structure having an opening therein.

* * * * *

UNITED STATES PATENT AND TRADEMARK OFFICE
CERTIFICATE OF CORRECTION

PATENT NO. : 5,539,251
DATED : July 23, 1996
INVENTOR(S) : Iverson et al

It is certified that error appears in the above-indentified patent and that said Letters Patent is hereby corrected as shown below:

On the title page, under INID code "[56] References Cited",
  please insert the reference — 5,235,207 8/93 Ohi et al. ...257/676—.

Column 4, line 28, after "instead" please insert — terminate —.

Column 6, line 48, after "leads" please delete the first occurrence of "through".

Column 8, please delete the return between lines 10 and 11.

Signed and Sealed this

Tenth Day of June, 1997

Attest:

BRUCE LEHMAN

Attesting Officer

Commissioner of Patents and Trademarks